(12) United States Patent
Wagner et al.

(10) Patent No.: US 12,259,753 B2
(45) Date of Patent: Mar. 25, 2025

(54) CASE FOR A TABLET SHAPED DEVICE

(71) Applicant: STM Management Pty Ltd, Alexandria (AU)

(72) Inventors: Bryant Wagner, Armstrong Creek (AU); Ethan Nyholm, Bondi Beach (AU)

(73) Assignee: STM Management Pty Ltd, Alexandria (AU)

( * ) Notice: Subject to any disclaimer, the term of this patent is extended or adjusted under 35 U.S.C. 154(b) by 0 days.

(21) Appl. No.: 18/923,084

(22) Filed: Oct. 22, 2024

(65) Prior Publication Data

US 2025/0044832 A1 Feb. 6, 2025

Related U.S. Application Data

(63) Continuation of application No. 18/737,963, filed on Jun. 8, 2024, now abandoned.

(30) Foreign Application Priority Data

Jun. 8, 2023 (AU) ................................ 2023901821

(51) Int. Cl.
*G06F 1/16* (2006.01)
*H05K 5/06* (2006.01)

(52) U.S. Cl.
CPC ............ *G06F 1/1628* (2013.01); *G06F 1/166* (2013.01); *H05K 5/069* (2013.01); *G06F 1/1632* (2013.01); *G06F 1/1669* (2013.01)

(58) Field of Classification Search
CPC .......... G06F 1/1628; G06F 2200/1633; G06F 1/166; G06F 1/1669; G06F 1/1654; G06F 1/1632; A45C 2011/003; H05K 5/069
See application file for complete search history.

(56) References Cited

U.S. PATENT DOCUMENTS

| | | | | |
|---|---|---|---|---|
| 7,393,242 | B1* | 7/2008 | Saje | G06F 1/1628 439/501 |
| 9,152,177 | B2* | 10/2015 | Feldstein | G06F 1/1632 |
| 10,516,431 | B2* | 12/2019 | DiLella | H02J 7/0044 |
| 10,698,452 | B2* | 6/2020 | Fenton | G06F 1/1607 |
| 11,388,970 | B2* | 7/2022 | Gordon | G06F 1/1628 |
| 2011/0199727 | A1* | 8/2011 | Probst | G06F 1/1632 361/679.09 |
| 2011/0222238 | A1* | 9/2011 | Staats | G06F 1/1632 361/679.55 |
| 2015/0001105 | A1* | 1/2015 | Nyholm | G06F 1/1628 29/401.1 |
| 2015/0189780 | A1* | 7/2015 | Su | H05K 5/03 361/807 |
| 2015/0244126 | A1* | 8/2015 | Carnevali | G06F 1/1628 439/527 |
| 2020/0249719 | A1* | 8/2020 | Nyholm | G06F 1/166 |

* cited by examiner

*Primary Examiner* — Nidhi Thaker
(74) *Attorney, Agent, or Firm* — Christensen, Fonder, Dardi & Herbert PLLC; Andrew H. Auderieth (57) ABSTRACT

Disclosed herein is a case for a tablet shaped device.

17 Claims, 15 Drawing Sheets

CASE FOR A TABLET SHAPED DEVICE

CROSS-REFERENCE TO RELATED APPLICATION

This application is a continuation of U.S. patent application Ser. No. 18/737,963, filed on Jun. 8, 2024, which claims priority to Australian Patent Application No. 2023901821, filed on Jun. 8, 2023, which are hereby incorporated by reference in their entireties.

TECHNICAL FIELD

The disclosure herein generally relates to a case for a tablet shaped device.

BACKGROUND

Examples of tablet shaped devices include but are not limited to a tablet computer, an APPLE IPAD PRO™, SAMSUNG GALAXY TAB S4™, AMAZON FIRE HB 8™, and a smart phone an example of which is an APPLE IPHONE™.

A computer keyboard and a tablet shaped device may each be configured to connect with each other. The tablet shaped device may have, for example, an electrical receptacle that can receive an electrical plug protruding from the computer keyboard.

SUMMARY

Disclosed herein is a case for a tablet shaped device. The case comprises a body comprising a peripheral wall and defines a tablet shaped device receiving area. The peripheral wall comprises a wall portion for a side edge of the tablet shaped device and another wall portion for another side edge of the tablet shaped device. The case comprises a connector at the wall portion for connecting to the tablet shaped device. The case comprises a conductor terminated by the connector and arranged to conduct at least one of power and a signal to the other wall portion.

An embodiment comprises a peripheral device at the other wall portion.

In an embodiment, the peripheral device is attached at the other wall portion.

In an embodiment, the peripheral device comprises a user input device.

In an embodiment, the peripheral device comprises a computer keyboard.

In an embodiment, the conductor is arranged to conduct at least one of power and the signal to the peripheral device.

In an embodiment, the peripheral device is attached to the body at the other wall portion.

In an embodiment, the connector is movable with respect to the wall portion.

In an embodiment, the conductor is pliable.

In an embodiment, the connector removably penetrates the other wall portion.

In an embodiment, the other wall portion defines a connector receiving cavity and an outwardly facing connector port opening communicating with the connector receiving cavity.

In an embodiment, the conductor passes through the other wall portion.

In the context of this document, a connector is a device that can mechanically engage another connector, and when so engaged allows power and/or signals to pass between the connector and the other connector. Examples of connectors include but are not limited to Lightening, USB-C, Micro USB, Mini USB, and dock connectors such as the Apple 30-pin dock connector.

In the context of this document, a peripheral device is a hardware device that can be placed in signal and/or power communication with a tablet shaped device. Examples of peripheral devices include but are not limited to computer keyboards, graphic tablets, data storage, modems, docks and electronic displays.

In the context of this document, a conductor is a thing that conducts power and/or signals.

Any of the various features of each of the above disclosures, and of the various features of the embodiments described below, can be combined as suitable and desired.

BRIEF DESCRIPTION OF THE DRAWINGS

Embodiments will now be described by way of example only with reference to the accompanying figures in which.

DESCRIPTION OF EMBODIMENTS

Figure 1:
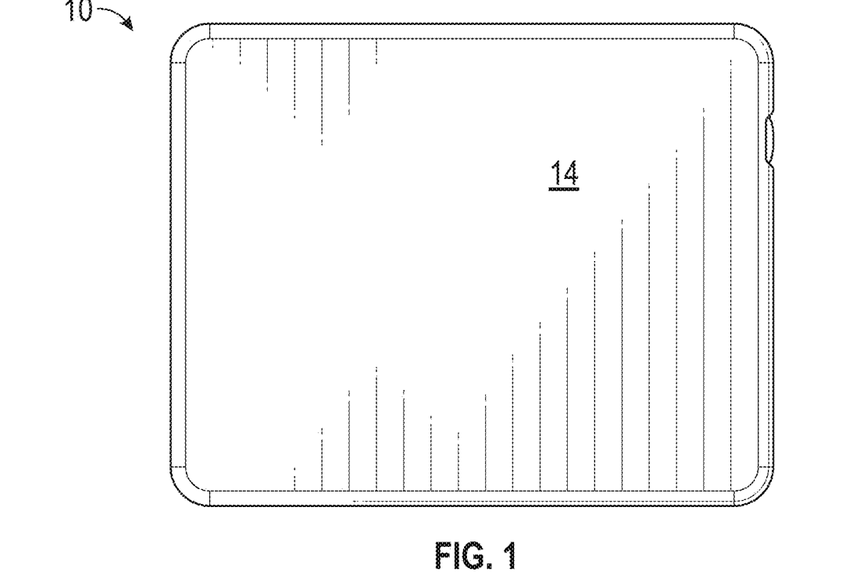
FIG. 1 shows a plan view of an embodiment of a case for a tablet shaped device, the case being in a closed configuration.
Figure 2:
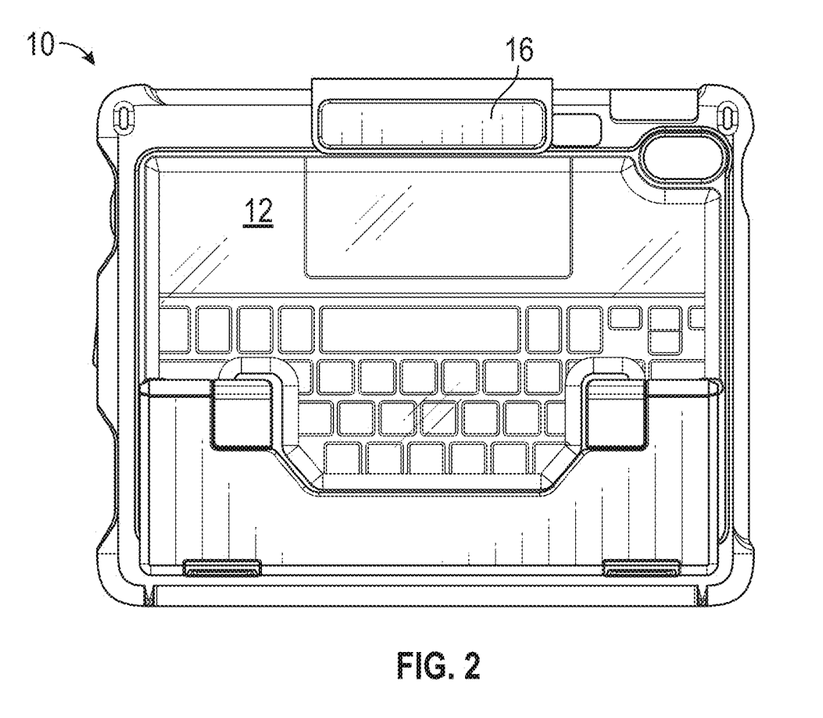
FIG. 2 shows a bottom view of the case in the closed configuration.
Figure 3:
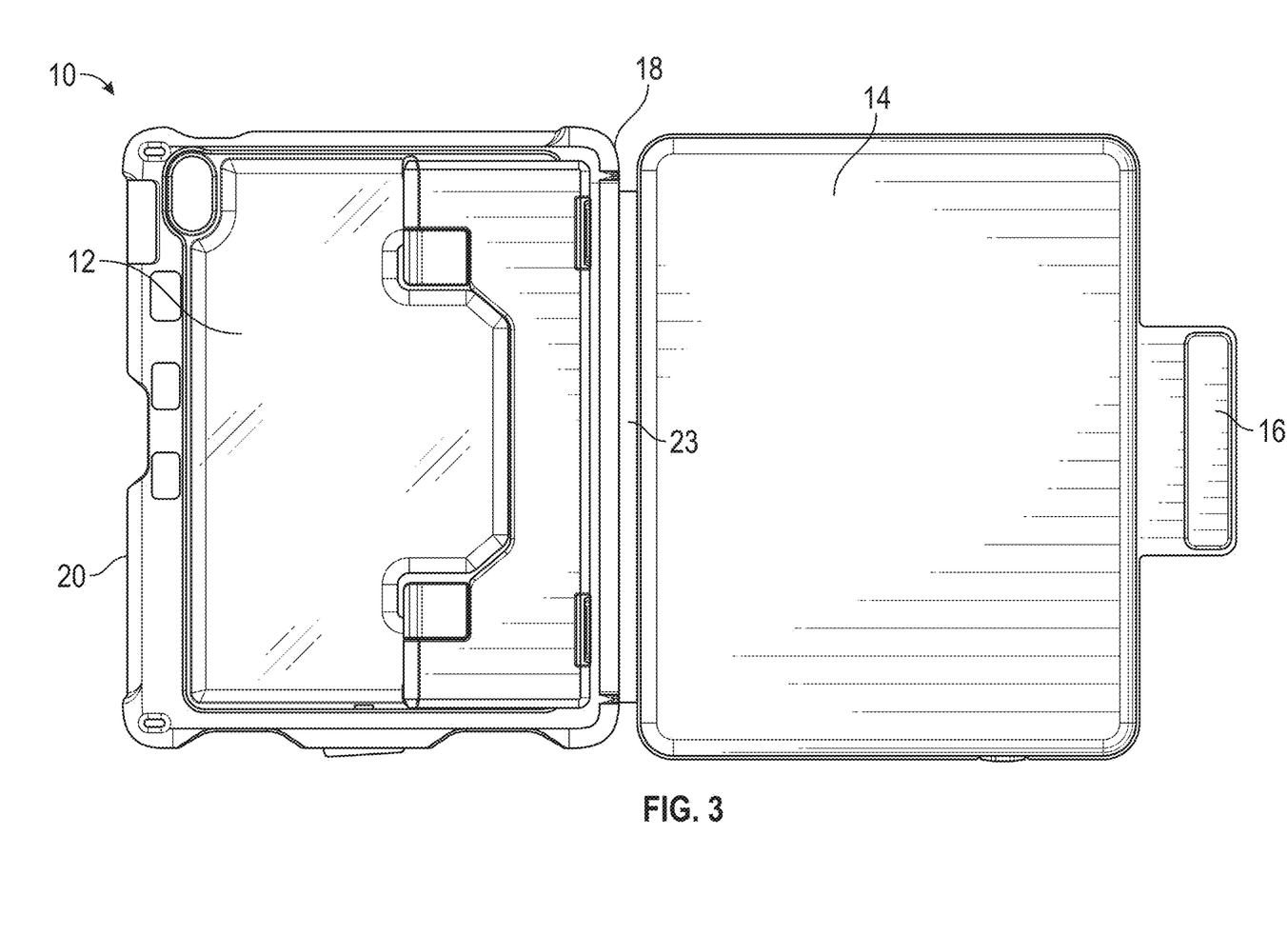
FIG. 3 shows a plan view of an exterior of the case for the tablet shaped device, the device being in an open configuration.

FIGS. 1 and 2 show plan and bottom views of embodiment of a case for a tablet shaped device in the form of a computer tablet, where the case is in a closed configuration and generally indicated by the numeral 10. The case 10 also has an open configuration, exterior and interior plan views of which are shown in FIGS. 3 and 4 respectively.

The case 10 comprises a body 12 in the form of a protective body configured to securely receive the tablet shaped device 10 therein (the "tablet shaped device receiving portion"). The body 12 optionally comprises both transparent and opaque materials. The case 10 also comprises a closure 14 in the form of a flap comprising a panel that is hingedly attached to an edge 18 of the body 12 by a membrane hinge 23 in the form of a pliable strip. The closure 14 can be secured in a closed position with respect to the body with a hingedly connected fastening flap 16 that can wrap around an opposite edge 20 of the body 12 and is magnetically attracted thereto. The body 12 and fastening flap 16 are magnetically attracted to each other by way of ferromagnetic components attached to each—and in this but not necessarily all embodiments embedded within each. When the tablet shaped device is received within the body 12 and the closure 14 secured in the closed position, the tablet shaped device may be protected from damaging contact, for example being dropped or bumped.

Figure 4:
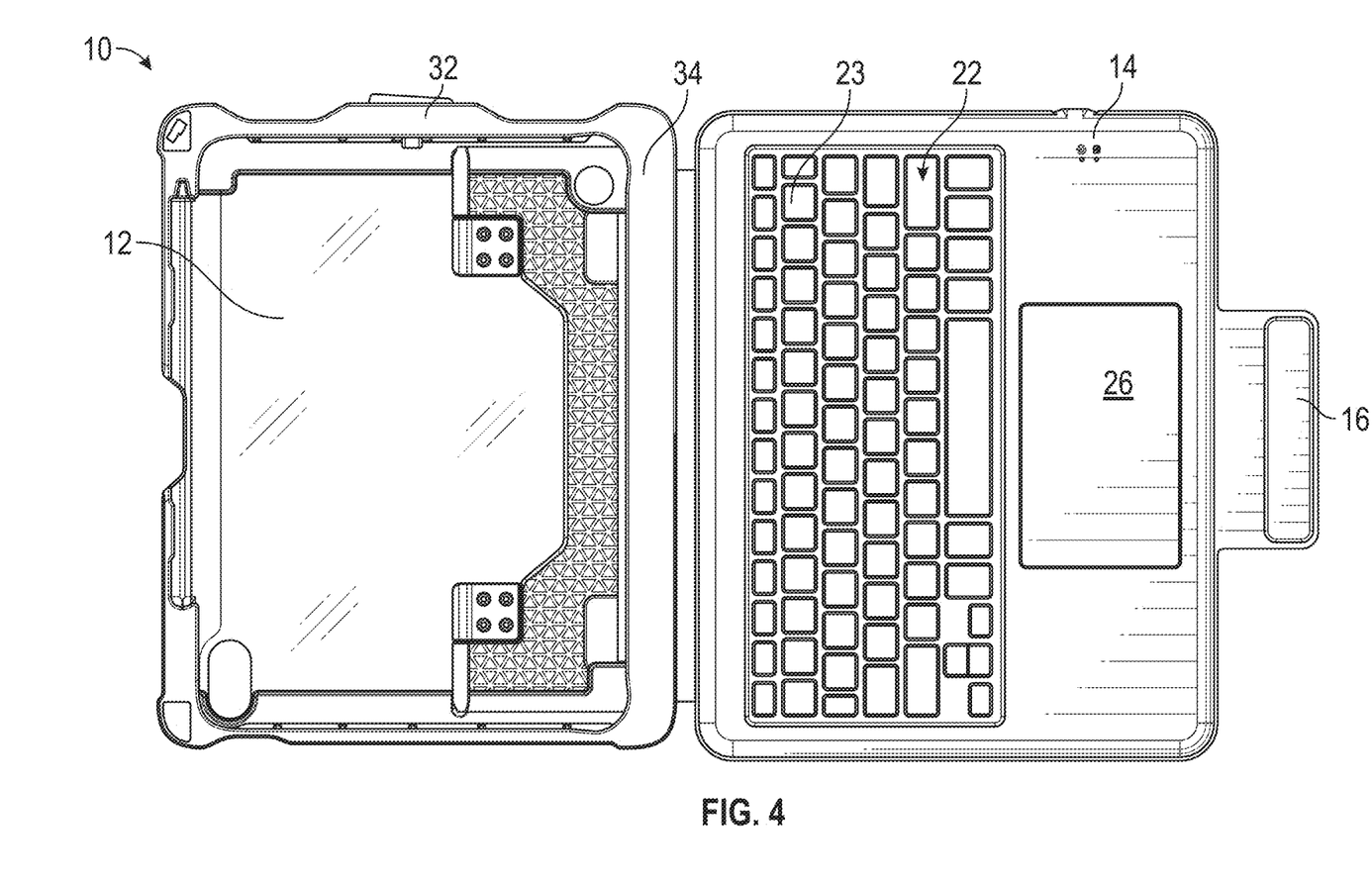
FIG. 4 shows a plan view of an interior of the case in an open position, revealing that the case comprises a tablet shaped device receiving portion hingedly connected to a closure comprising an example of a computer keyboard.
Figure 5:
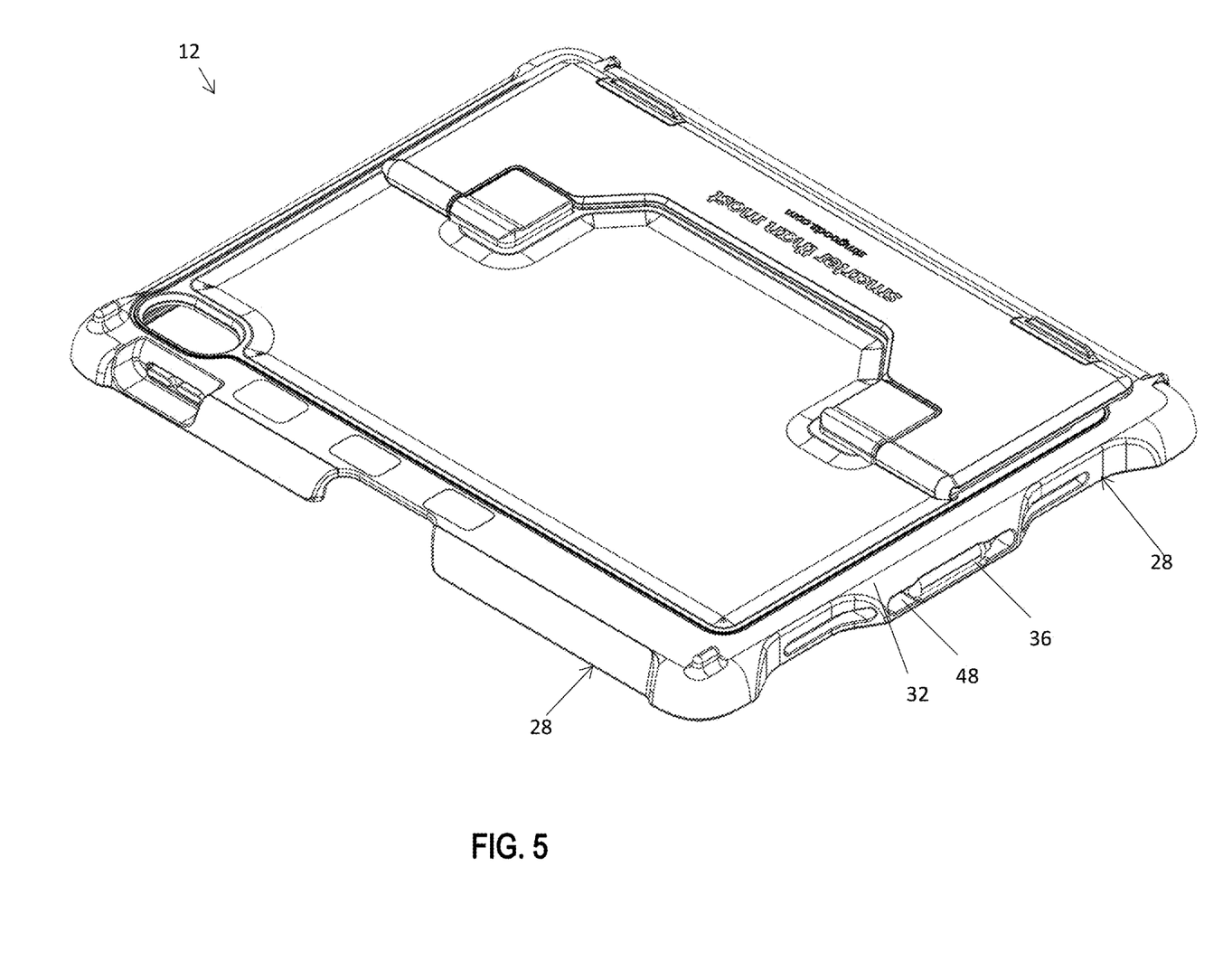
FIG. 5 shows a rear isometric view of the tablet shaped device receiving portion of the case.
Figure 6:
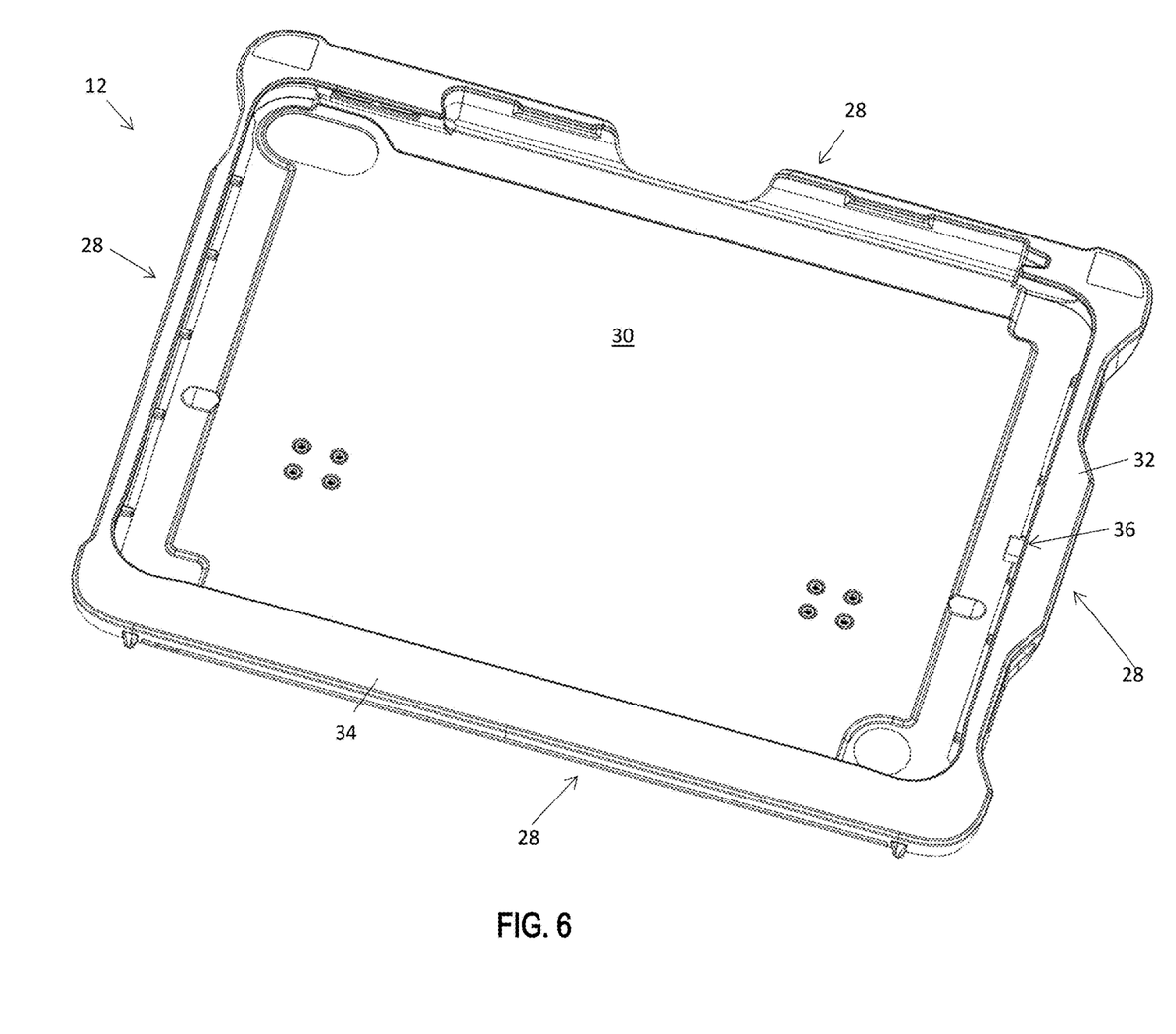
FIG. 6 shows a front isometric view of the tablet shaped device receiving portion.
Figure 7:
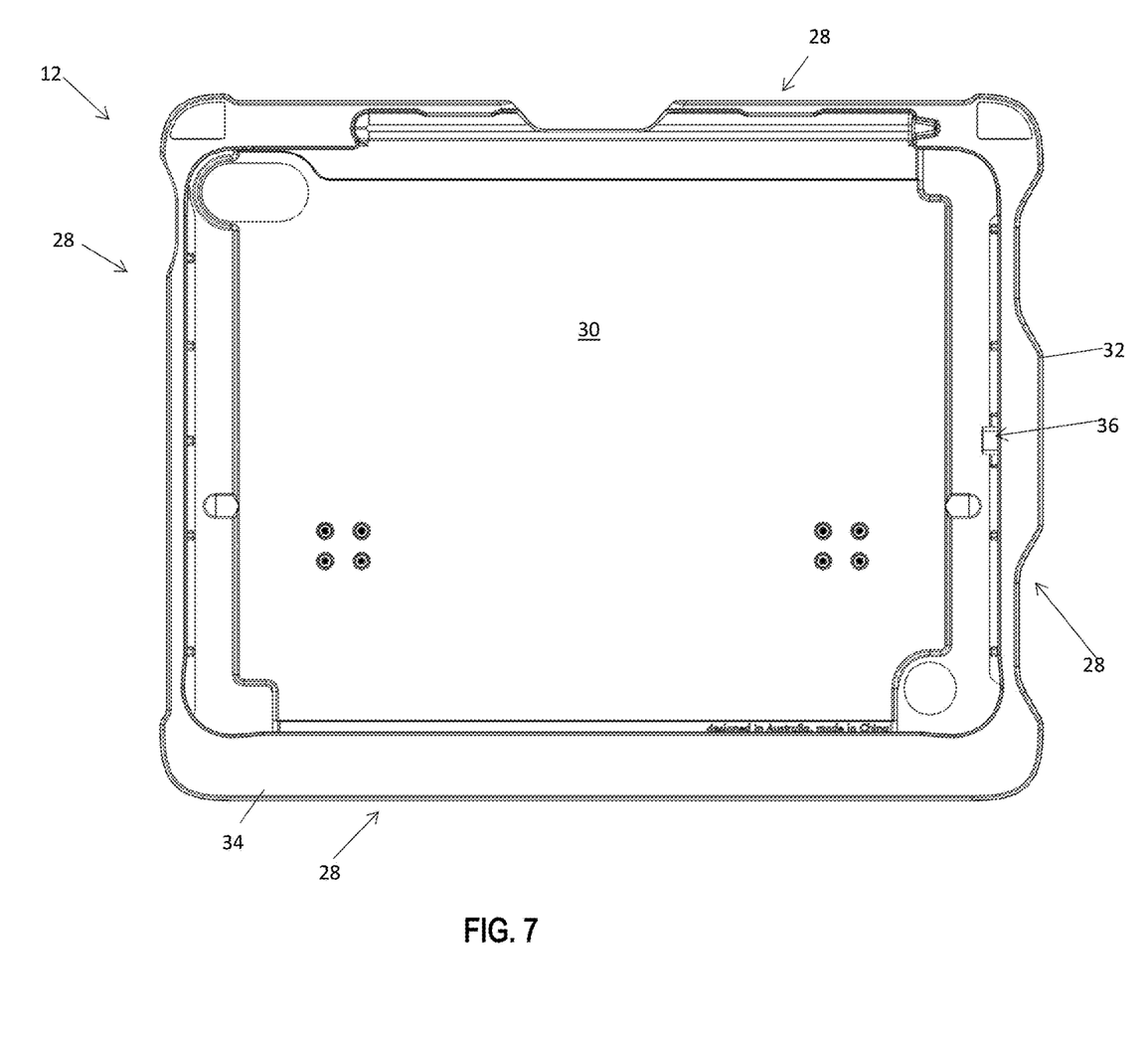
FIG. 7 shows a front view of the tablet shaped device receiving portion.
Figure 8:
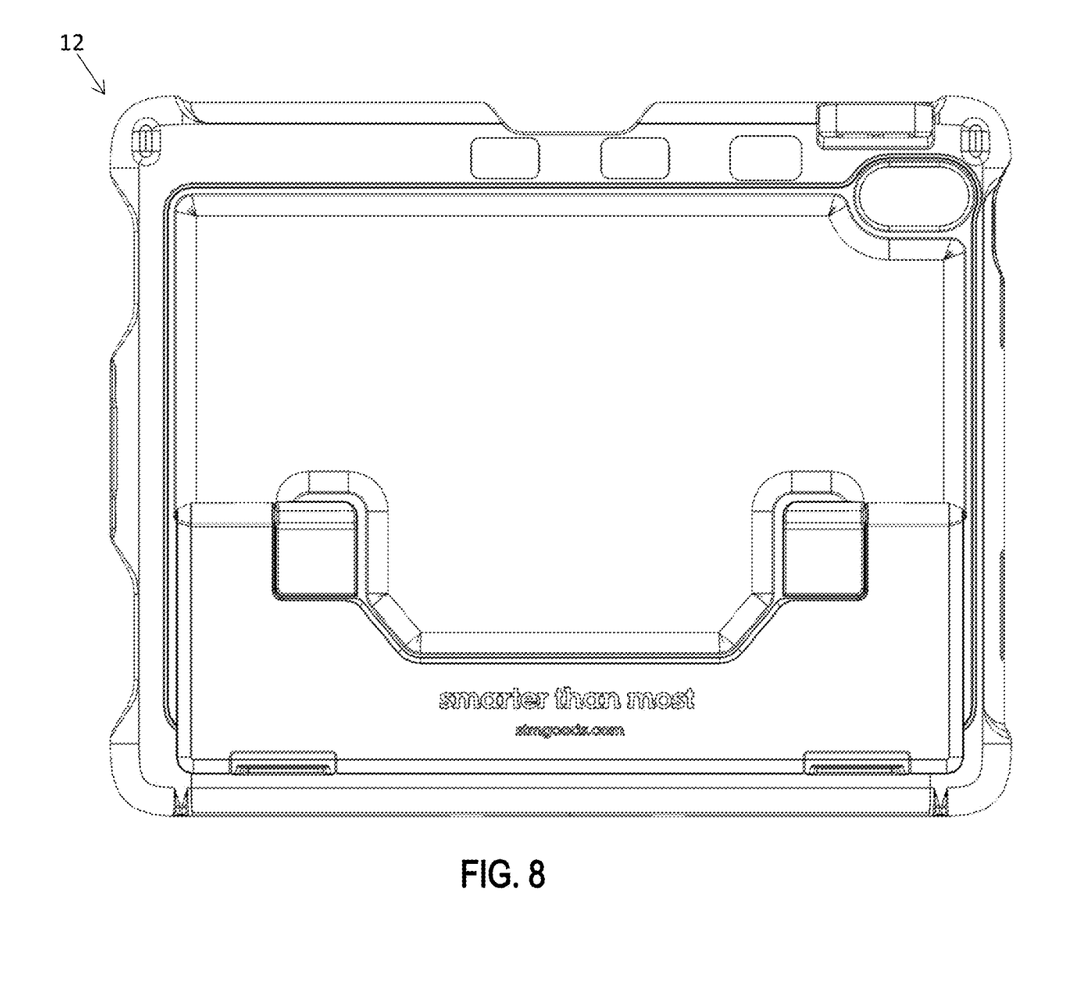
FIG. 8 shows a rear view of the tablet shaped device receiving portion.

FIG. 4 shows an interior plan view, revealing that the flap 14 comprises a peripheral device 22 in the form of an input device comprising a computer keyboard 23 and a computer pointing device in the form of a computer trackpad 26. The peripheral device 22 is at an interior surface of the closure 14, which may provide protection when the closure 14 is secured in the closed position by the magnetic fasteners.

Figure 9:
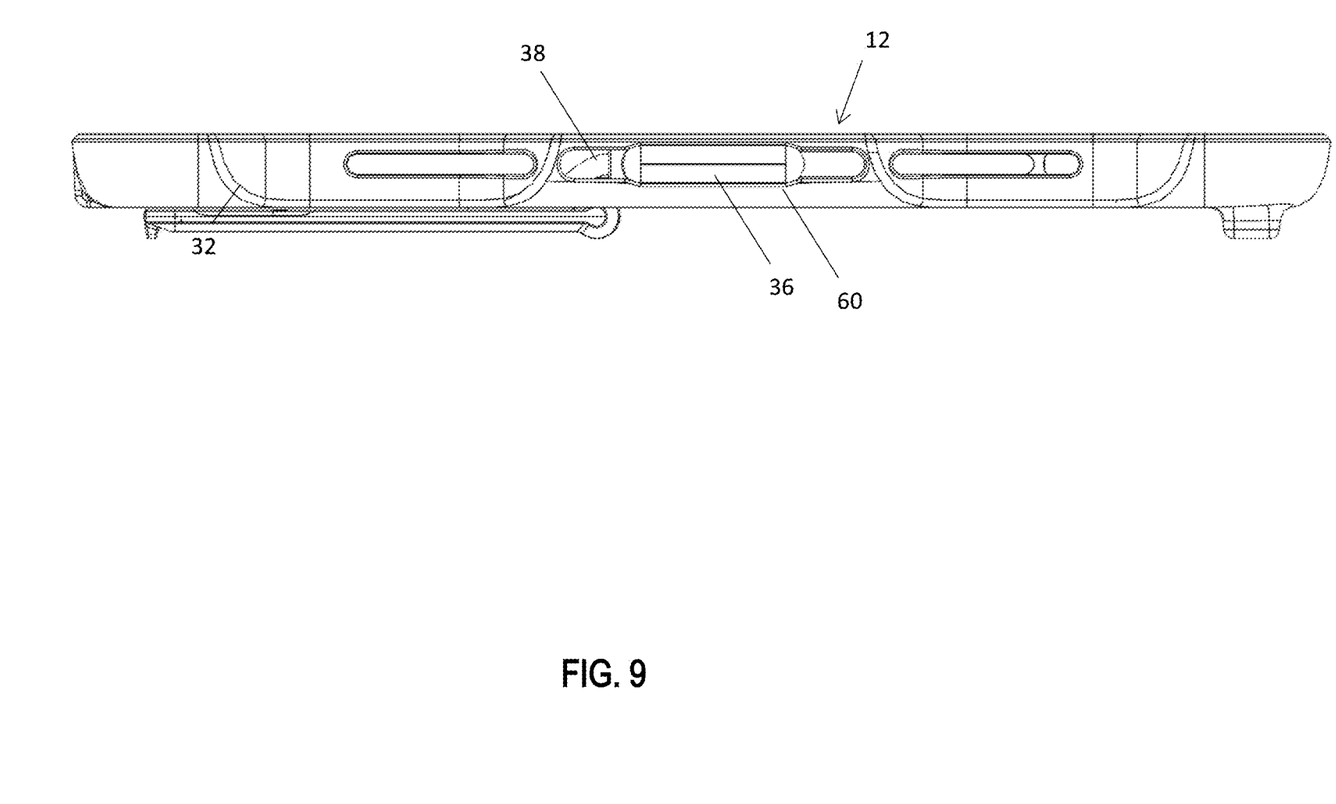
FIG. 9 shows a side elevation view of the tablet shaped device receiving portion.
Figure 10:
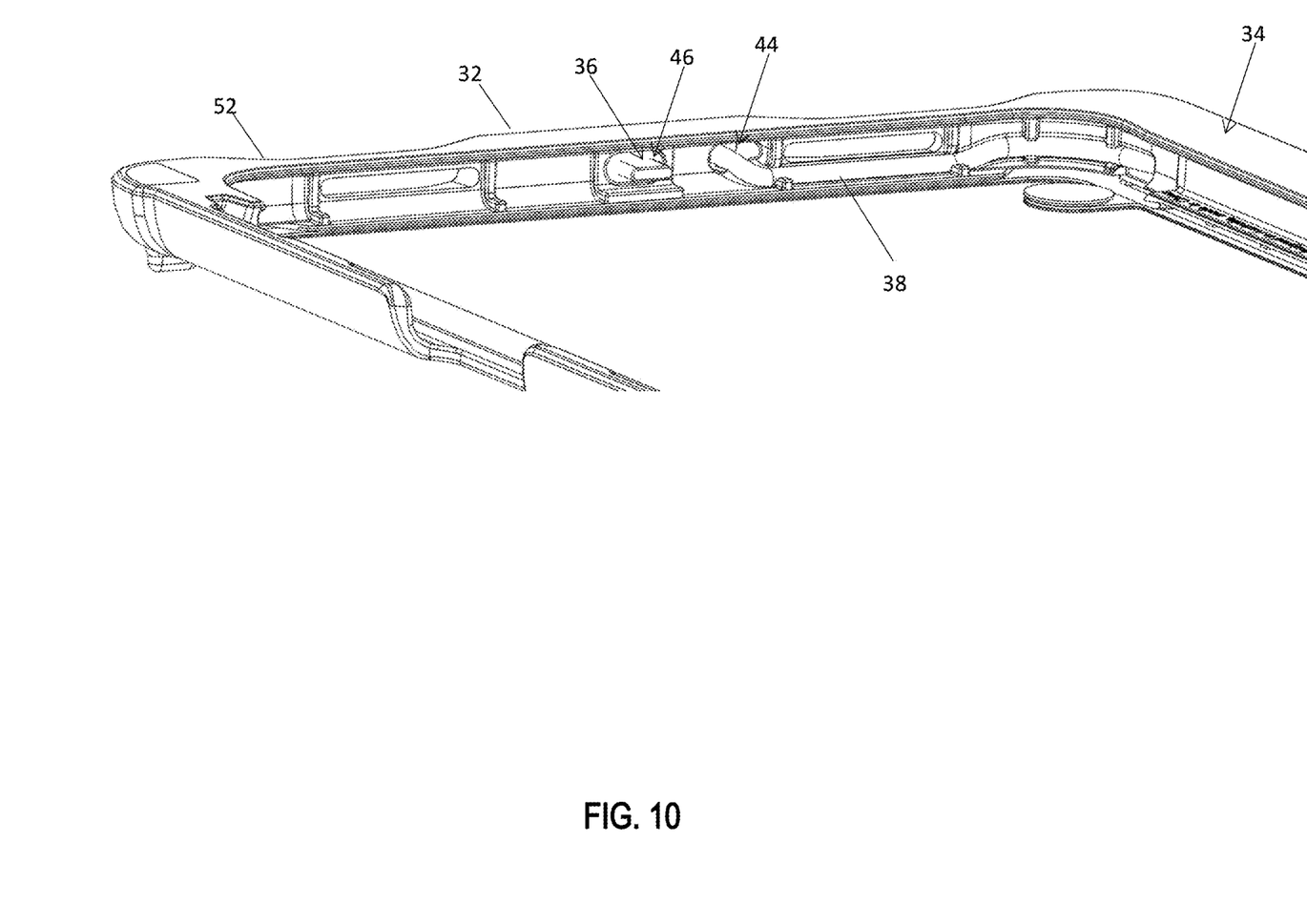
FIGS. 10 and 11 show isometric views of a portion of a perimeter of the tablet shaped device receiving portion with parts hidden for illustrative purposes.
Figure 11:
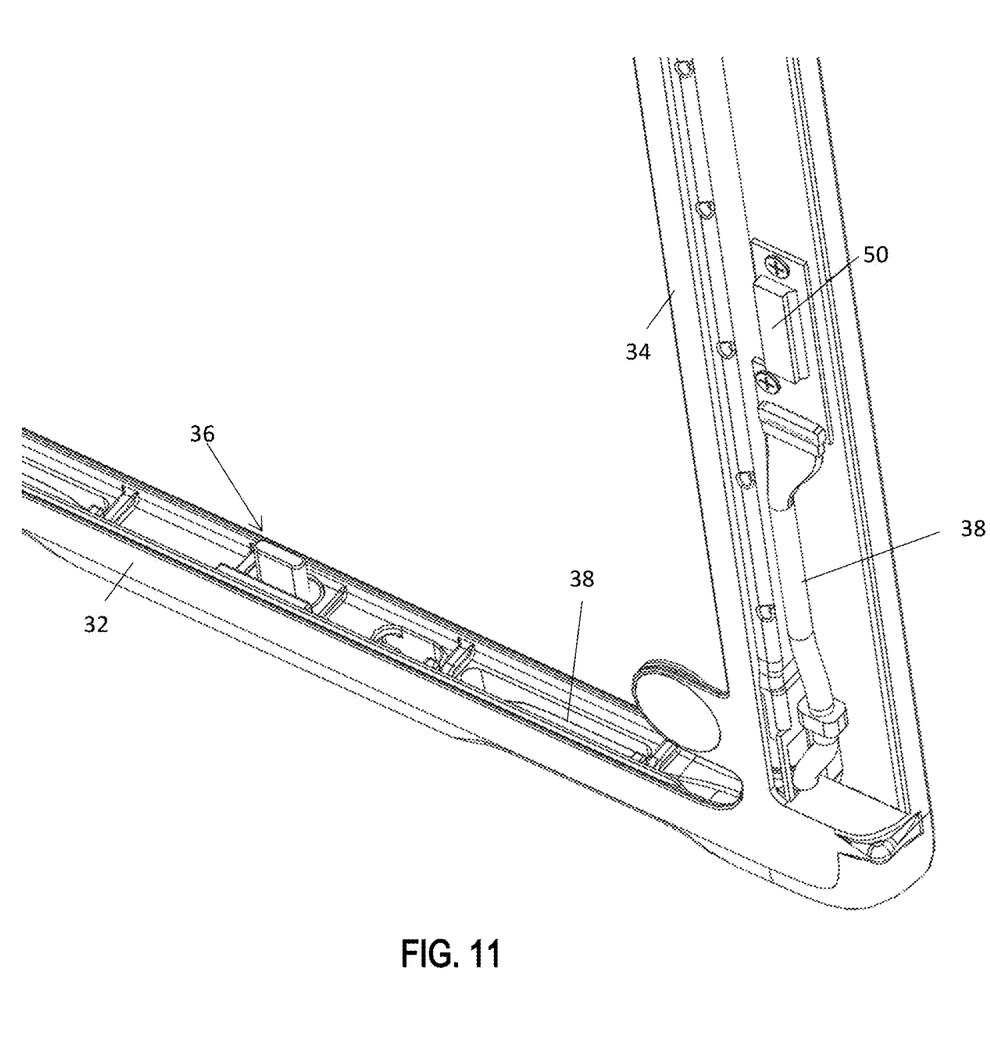
Figure 12:
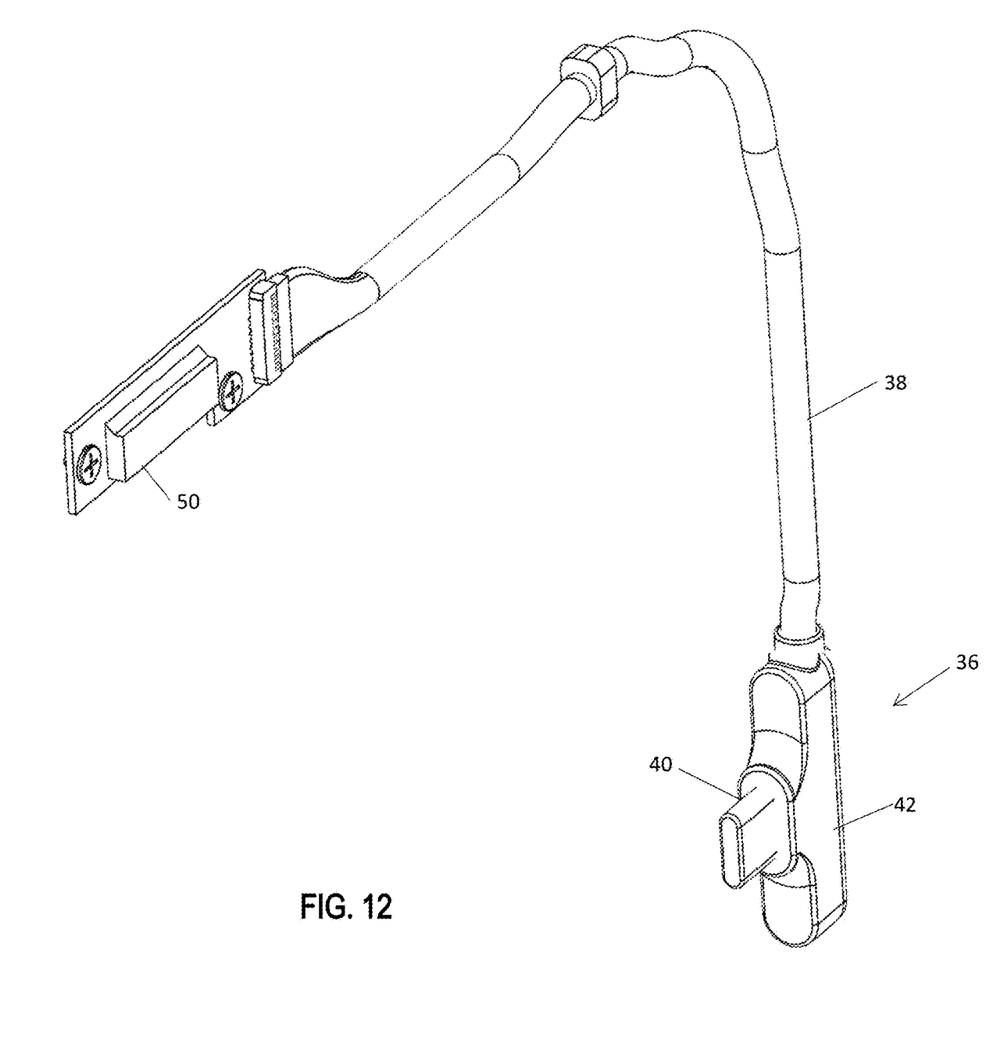
FIGS. 12 and 13 show isometric views of a conductor terminated by connectors which are associated with the perimeter of the tablet shaped device receiving portion.
Figure 13:
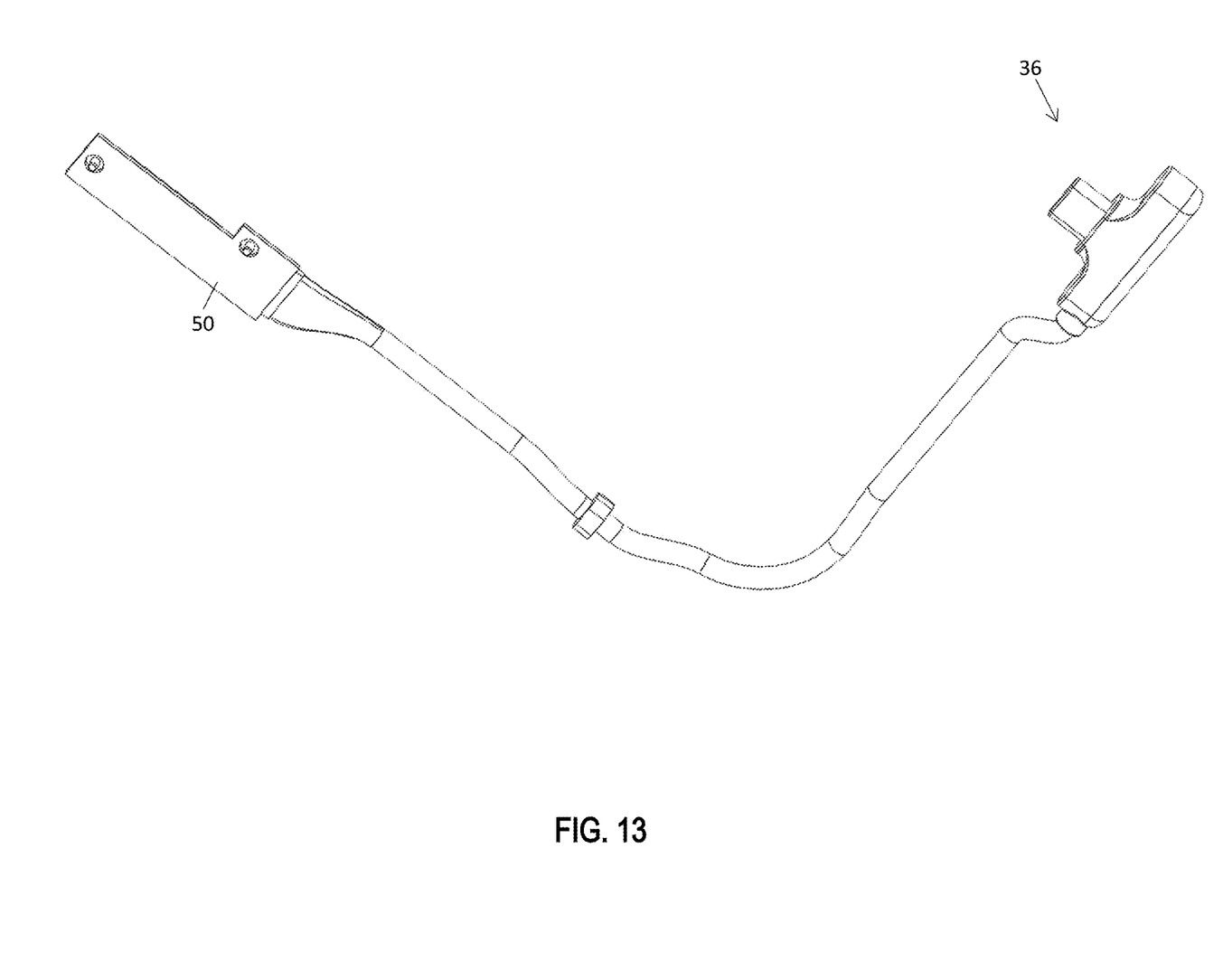

FIGS. 5 to 8 show various view of the body 12 of the case 10 with the flap 14 hidden for illustrative purposes. The body 12 comprises a peripheral wall 28 defining a tablet shaped device receiving area 30 interior of the case 10, the peripheral wall 28 comprising a wall portion 32 for a side edge of the tablet shaped device and another wall portion 34 associated with another side edge of the tablet shaped device adjacent to the wall portion 32. The body 12 comprises a connector 36 in the form of a USB-C plug connector at the wall portion 32 for connecting to the tablet shaped device when received within the body 12. As seen in FIGS. 9 to 11, the connector 36 terminates a conductor 38 in the form of a pliable cable, arranged to conduct at least one of power and a signal to the other wall portion 34. FIGS. 12 and 13 show perspective views of the connector 36 and the conductor 38 isolated for illustrative purposes. The connector 36 is revealed to be T-shaped comprising a plug portion 40 meeting an elongated strain relief portion 42 at a T-shaped joint. The connector 36 is movable by bending the pliable conductor 38 with respect to the wall portion 32. Consequently, the connector 36 may be manipulated by a user for insertion of the plug portion 40 into the tablet shaped device's receptacle connector.

FIGS. 9 to 11 show the routing of the conductor 38 within the peripheral wall 28 which defines a channel or duct for the conduit 38. The conductive path defined by the connector 36 and the conduit 38 weaves through the wall portion 32. The conductor 38 passes from the interior to the exterior through an aperture 44 defined by the wall portion 32. The plug portion 36 passes from the exterior to the interior through another aperture 46 defined by the wall portion 32. The connector 36 removably penetrates the wall portion 32. The wall portion 32 defines a connector receiving cavity 48 that is elongated and having an outwardly facing connector port 60 communicating with connector receiving cavity 48. When removably disposed in the cavity 48, the connector 36 is protected and less likely to snag and pull out. However, the connector 36 can be removed from the cavity to disconnect the connector 36 from the tablet shaped device and allow removal of the tablet shaped device from the case 10. The connector 36 also assists fixing the tablet shaped device within the body by acting as a locking pin. The other end of the conductor 38 is disposed within a passageway in the form of a tunnel and defined by the other wall portion 34, and is terminated by another connector 50 in the form of a ribbon cable connector for connection with a ribbon cable that is disposed at the hinged connection between the body 12 and the closure 14 and enables communication between the peripheral device 22 and the connector 36.

The frontward facing opening of the body 12 is constricted by a resilient lip 52 projecting inwardly from the peripheral wall. The tablet shaped device may be inserted by squeezing it through the opening defined by the resilient lip 52. The at least one resilient lip 52 deforms to accommodate the passage of the tablet shaped device, and recoils back into shape subsequent to passage of the tablet shaped device.

The interior comprises an optional inner lining in the form of an inner felt lining. The inner lining provides a relatively soft surface to reduce scratching of the tablet shaped device.

Figure 14:
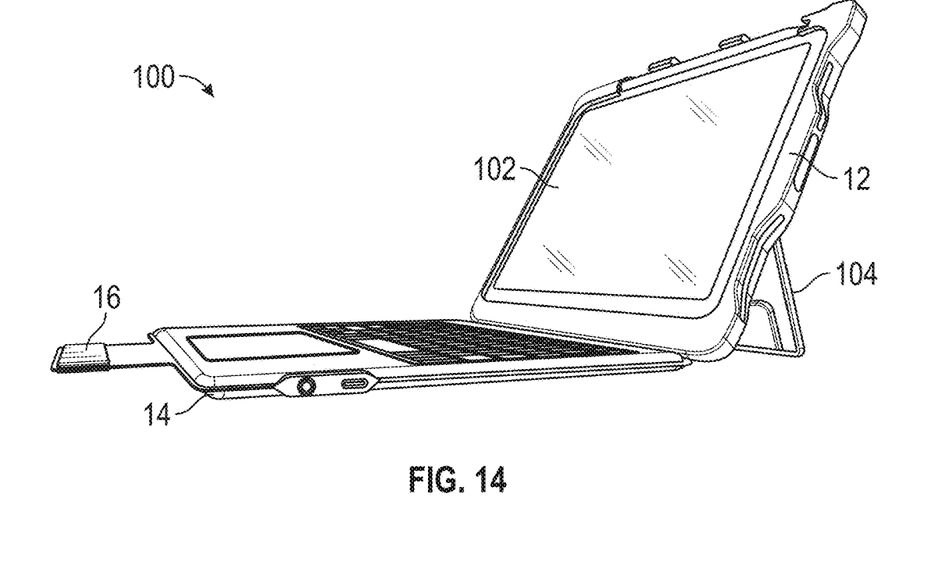
FIG. 14 shows an isometric view of another embodiment of case for a tablet shaped device with a tablet shaped device received therein, the case being open and a case stand extended.
Figure 15:
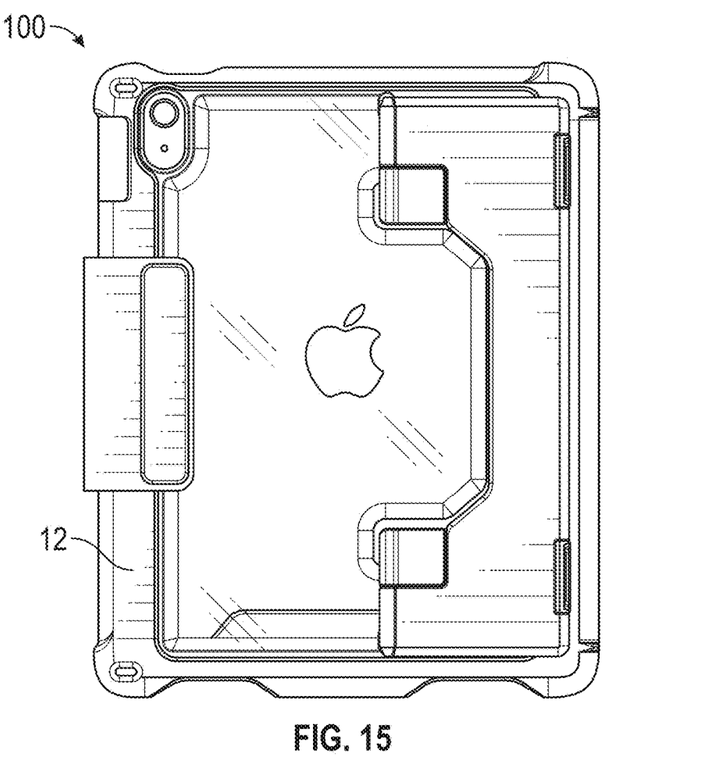
FIG. 15 shows a plan view of the case of FIG. 14 with the tablet shaped device received therein, the case being closed.
Figure 16:
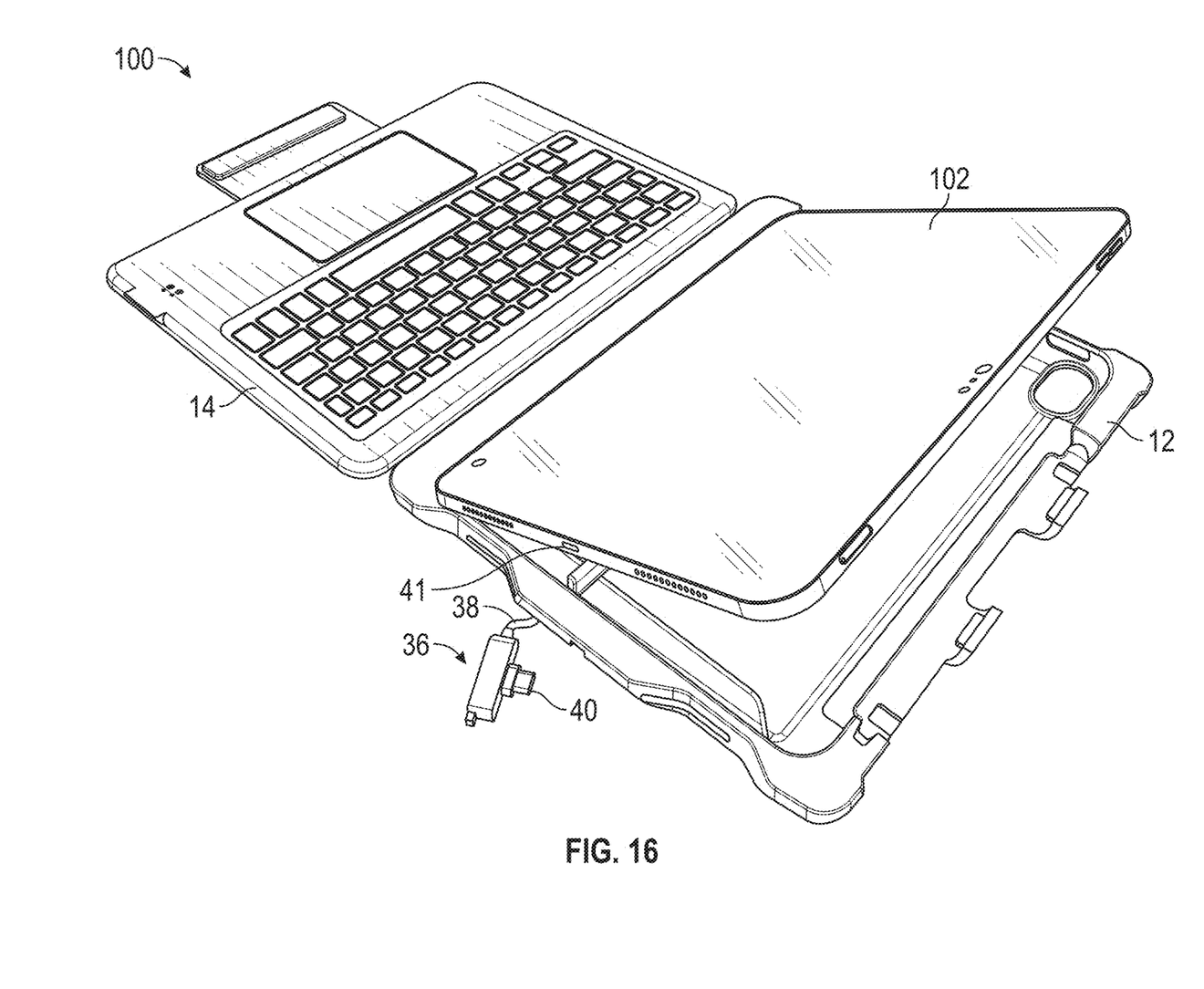
FIG. 16 shows an isometric view of the case of FIG. 14 open, with the tablet shaped device being inserted into the case.
Figure 17:
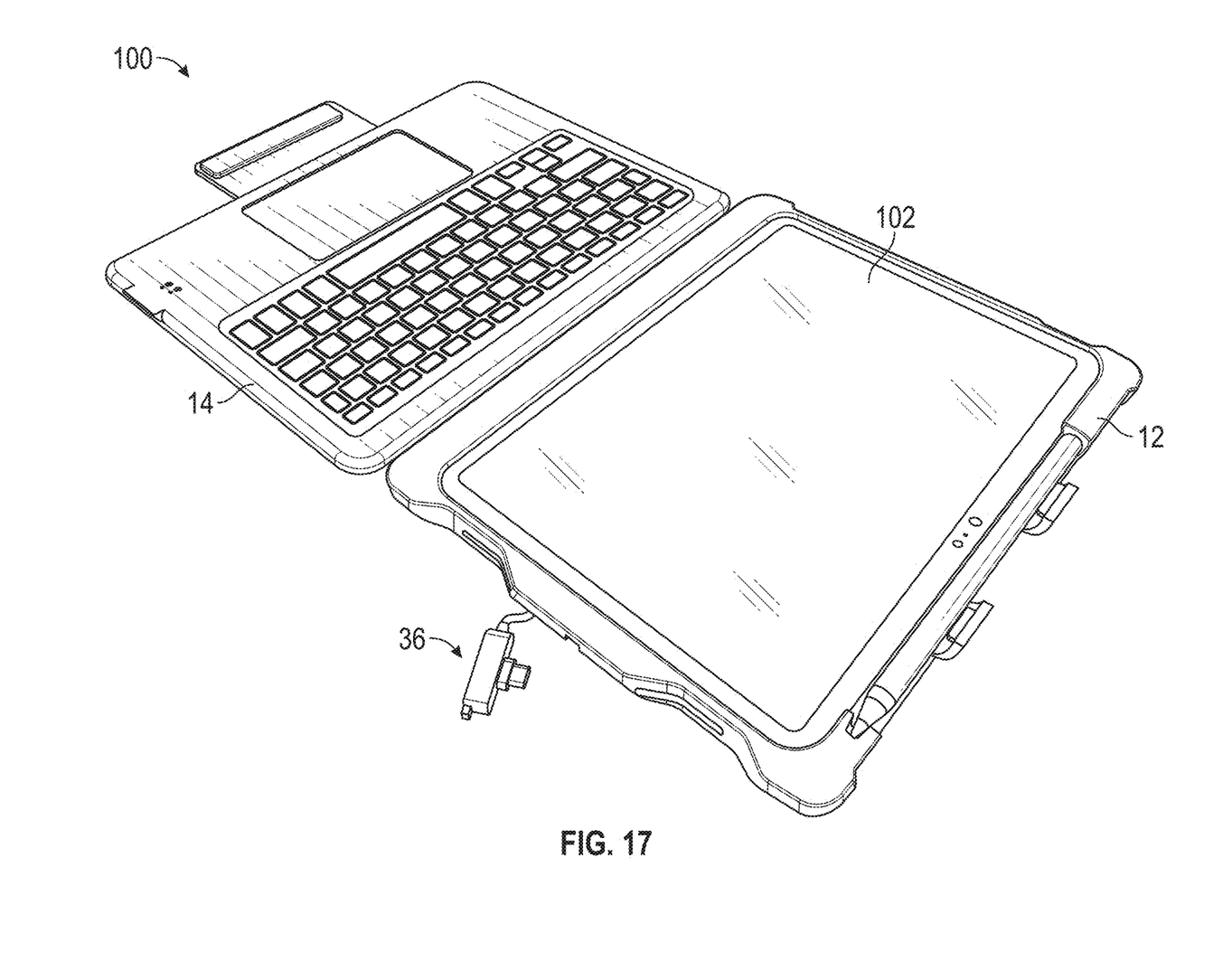
FIG. 17 shows an isometric view of the case of FIG. 14 open, with the table shaped device received thereby.

FIGS. 14 to 17 show various views of another embodiment of case 100 for a tablet shaped device 102. Parts similar or identical in form and/or function to those in FIGS. 1 to 13 are similarly numbered. In FIG. 14, the tablet shaped device 102 is received within the case 100, the case being open and a case stand 104 extended. A user can place the case 100 on a surface, for example a table or bench, and engage with the user interface, the case stand 104 elevating the tablet shaped device 102 over the surface. FIG. 15 shows a plan view of the case 100 with the tablet shaped device received therein, the case being closed. FIG. 16 shows an isometric view of the case 100 open, with the table shaped device 102 being inserted into the case 100. The connector plug 40 of the case 100 is to be received by the connector socket 41 of the tablet shaped device 102. In this embodiment, the connectors 40 and 41 are USB-C connectors, however generally any suitable and desired connector can be used, for example RJ-42 connectors. FIG. 17 shows an isometric view of the case of FIG. 14 open, with the table shaped device received thereby.

A one or two step injection molding process may be used to fabricate the cases 10 and 100.

Now that embodiments have been described, it will be appreciated that some embodiments may have the following advantage:

The peripheral can be placed along an edge of the tablet shaped device without a connector, and yet the tablet shaped device and the peripheral can be connected for signal and/or power communication therebetween.

Variations and/or modifications may be made to the embodiments described without departing from the spirit or ambit of the invention. For example:

The connectors may be any suitable form of connector, examples of which include but are not limited to Lightening and micro-USB.

The conductors may take any suitable form and configuration, including round cables and flat cables.

The hinge may generally take any suitable form, for example the hinge may have a hinge pin.

The peripheral device may, for example, have only one of the computer keyboard and the trackpad, or have additional and/or different features.

The keyboard and/or trackpad may have different configurations.

The closure may be fastened using generally any suitable way, examples of which include but are not limited to clips and hook-and-loop fasteners.

Other embodiments may not have an inner lining or may have another suitable lining material.

The conductor may conduct light.

Component parts may be, for example, opaque or transparent as desired and suitable.

The present embodiments are, therefore, to be considered in all respects as illustrative and not restrictive. Reference to a feature disclosed herein does not mean that all embodiments must include the feature.

Prior art, if any, described herein is not to be taken as an admission that the prior art forms part of the common general knowledge in any jurisdiction.

In the claims which follow and in the preceding description of the invention, except where the context requires otherwise due to express language or necessary implication, the word "comprise" or variations such as "comprises" or "comprising" is used in an inclusive sense, that is to specify the presence of the stated features but not to preclude the presence or addition of further features in various embodiments of the invention.

The invention claimed is:

1. A case for a tablet shaped device, the case comprising: a tablet shaped device protective body comprising a peripheral wall and defining a tablet shaped device receiving area, the peripheral wall comprising a wall portion for a side edge of the tablet shaped device and another wall portion for another side edge of the tablet shaped device; a closure hingedly attached to the body at the other wall portion, and comprising an interior surface at which are a computer keyboard and a computer trackpad, the closure having an open position in which the tablet receiving area is revealed and a closed position in which the tablet shaped device receiving area, the computer keyboard and the computer trackpad are concealed; a plug connector at the wall portion for connecting to the tablet shaped device, the wall portion defining a plug connector receiving cavity; a conductor terminated by the plug connector and arranged to conduct at least one of power and a signal between the wall portion and the computer keyboard and the computer trackpad, the conductor being routed through a passageway defined by the peripheral wall, wherein the conductor passes from an interior to an exterior via an aperture defined by the wall portion, and a plug portion of the plug connector removably penetrates the wall portion from the exterior to the interior via another aperture defined by the wall portion.

2. The case of claim 1 wherein the computer keyboard and the computer trackpad are attached at the other wall portion.

3. The case of claim 1 wherein the computer keyboard and the computer trackpad are attached to the body at the other wall portion.

4. The case of claim 1 wherein the conductor passes through the other wall portion.

5. The case of claim 1 and the tablet shaped device received by the tablet shaped device receiving area.

6. A case for a tablet shaped device comprising: a peripheral wall defining a tablet shaped device receiving area, the peripheral wall defining a channel between the receiving area and the peripheral wall; a conductor extending within the channel along at least two sides of the peripheral wall, the conductor being routed from an inside to an outside through an exit aperture defined by the peripheral wall and terminating at a first connector portion, the first connector portion conforming to a recess in an exterior of the peripheral wall, the first connector portion comprising a plug portion removably extendable from the outside to the inside through a plug aperture within the recess and defined by the peripheral wall.

7. The case of claim 6 wherein the conductor is pliable.

8. The case of claim 6 wherein the plug is a USB-C connector.

9. The case of claim 6 wherein the conductor terminates at a second connector portion, the second connector portion at an opposite end of the conductor from the first connector portion.

10. The case of claim 6 wherein the second connector is a ribbon cable connector.

11. A case for a tablet shaped device comprising: a tablet shaped device protective body comprising a peripheral wall and defining a tablet shaped device receiving area, the peripheral wall further defining a channel between the receiving area and the peripheral wall; a conductor extending within the channel along at least two sides of the peripheral wall, wherein the conductor terminates at a plug connector and is configured to conduct at least one of power and a signal between the plug connector and a computer keyboard, wherein the conductor passes from an interior to an exterior through an aperture defined by the peripheral wall, and a plug portion of the plug connector removably penetrates the peripheral wall into the interior from the exterior through another aperture defined by the peripheral wall; a closure hingedly attached to the body comprising an interior surface with the computer keyboard, the closure having an open position in which the tablet receiving area is revealed and a closed position in which the tablet shaped device receiving area and the computer keyboard are concealed; a stand on a back surface of the body, the stand being extendable to elevate the body from a surface.

12. The case of claim 11 wherein the stand is configured to be planar with the back surface of the body in a closed position.

13. The case of claim 11 wherein the peripheral wall comprises an inwardly projecting resilient lip.

14. The case of claim 13 wherein the resilient lip is deformable by squeezing allowing the tablet to be inserted into the receiving area.

15. The case of claim 14 wherein the resilient lip recoils back into shape subsequent to passage of the tablet.

16. The case of claim 11 wherein the hinge is a membrane hinge.

17. The case of claim 11 wherein the conductor is pliable.

* * * * *